(12) United States Patent
Lallement et al.

(10) Patent No.: US 10,739,807 B2
(45) Date of Patent: Aug. 11, 2020

(54) BODY BIASING FOR ULTRA-LOW VOLTAGE DIGITAL CIRCUITS

(71) Applicant: STMICROELECTRONICS (CROLLES 2) SAS, Crolles (FR)

(72) Inventors: Guenole Lallement, Grenoble (FR); Fady Abouzeid, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 4 days.

(21) Appl. No.: 16/127,771

(22) Filed: Sep. 11, 2018

(65) Prior Publication Data

US 2020/0081476 A1 Mar. 12, 2020

(51) Int. Cl.
| | |
|---|---|
| *G05F 3/20* | (2006.01) |
| *H03K 19/0948* | (2006.01) |
| *H01L 29/78* | (2006.01) |
| *H01L 27/092* | (2006.01) |
| *H03K 19/00* | (2006.01) |
| *G06F 30/30* | (2020.01) |

(52) U.S. Cl.
CPC ............. *G05F 3/205* (2013.01); *G06F 30/30* (2020.01); *H01L 27/0928* (2013.01); *H01L 29/7851* (2013.01); *H03K 19/0013* (2013.01); *H03K 19/0948* (2013.01)

(58) Field of Classification Search
None
See application file for complete search history.

(56) References Cited

U.S. PATENT DOCUMENTS

| | | | |
|---|---|---|---|
| 5,322,994 | A | 6/1994 | Uno |
| 5,900,623 | A | 5/1999 | Tsang et al. |
| 5,910,738 | A | 6/1999 | Shinohe et al. |
| 6,097,022 | A | 8/2000 | Merrill et al. |
| 6,593,799 | B2 | 7/2003 | De et al. |
| 6,759,873 | B2 | 7/2004 | Kang et al. |
| 6,821,808 | B2 | 11/2004 | Nakamura et al. |
| 6,967,522 | B2 | 11/2005 | Chandrakasan et al. |
| 7,349,018 | B2 | 3/2008 | Doering et al. |

(Continued)

OTHER PUBLICATIONS

Lallement, et al.: "A 2.7pJ/cycle 16MHz SoC with 4.3nW Power-Off ARM Cortex-M0+ Core in 28nm FD-SOI", SSCIRC; 2017, Sep. 2017, Leuven, Belgium (4 pages).

(Continued)

*Primary Examiner* — Cassandra F Cox
(74) *Attorney, Agent, or Firm* — Crowe & Dunlevy

(57) ABSTRACT

A digital circuit includes logic circuitry formed by logic gates. Each logic gate includes a p-channel MOSFET and an n-channel MOSFET. A body bias generator circuit applies an n-body bias voltage to the n-body bias nodes of the p-channel MOSFETs and applies a p-body bias voltage to the p-body bias nodes of the n-channel MOSFETs. The body bias generator circuit operates in: a first mode to apply a ground supply voltage to the n-body bias nodes of the logic gates as the n-body bias voltage and apply a positive supply voltage to the p-body bias nodes of the logic gates as the p-body bias voltage; and a second mode to apply the positive supply voltage to the n-body bias nodes of the logic gates as the n-body bias voltage and apply the ground supply voltage to the p-body bias nodes of the logic gates as the p-body bias voltage.

22 Claims, 4 Drawing Sheets

(56) References Cited

U.S. PATENT DOCUMENTS

| | | |
|---|---|---|
| 8,294,492 B2 | 10/2012 | Bol et al. |
| 8,587,365 B1 | 11/2013 | Srinivasa Raghavan et al. |
| 8,780,101 B2 | 7/2014 | Tsujino et al. |
| 8,816,754 B1 | 8/2014 | Clark et al. |
| 9,112,484 B1 | 8/2015 | Clark et al. |
| 9,112,495 B1 | 8/2015 | Clark et al. |
| 9,166,069 B2 | 10/2015 | Sugizaki et al. |
| 9,426,395 B2 | 8/2016 | Jakobson et al. |
| 9,710,006 B2 | 7/2017 | Boling |
| 9,800,814 B2 | 10/2017 | Jin et al. |
| 9,854,194 B2 | 12/2017 | Ni |
| 9,979,920 B2 | 5/2018 | Mizuguchi |
| 2006/0223201 A1* | 10/2006 | Liu .................. G01R 31/2642 438/10 |
| 2008/0054989 A1* | 3/2008 | Choi ..................... G05F 3/205 327/534 |
| 2009/0108905 A1 | 4/2009 | Wang et al. |
| 2009/0237135 A1* | 9/2009 | Ramaraju ............ H03K 3/3565 327/205 |
| 2012/0086499 A1* | 4/2012 | Husain ................ H03K 17/145 327/434 |
| 2018/0166901 A1 | 6/2018 | Yu |
| 2019/0326911 A1* | 10/2019 | Kumar .................. H03K 19/20 |

OTHER PUBLICATIONS

Quelen, et al.: "A 2.5μW 0.0067mm2automatic back-biasing compensation unit achieving 50% leakage reduction in FDSOI 28nm over 0.35-to-1V VDDrange", 2018 IEEE International Solid-State Circuits Conference—(ISSCC) (3 pages).

Tschanz, et al.: "Adaptive body bias for reducing impacts of die-to-die and within-die parameter variations on microprocessor frequency and leakage", IEEE Journal of Solid-State Circuits (vol. 37, Issue: 11, Nov. 2002 ) (pp. 1396-1402).

* cited by examiner

BODY BIASING FOR ULTRA-LOW VOLTAGE DIGITAL CIRCUITS

TECHNICAL FIELD

The present invention relates to body biasing of transistors in digital circuits and, in particular, to the implementation of dynamic forward and reverse body biasing for ultra-low voltage digital circuits.

BACKGROUND

It is well known in the art to apply a body bias to the well region of a metal oxide semiconductor field effect transistor (MOSFET) in order to influence the properties of the transistor channel. For example, a forward body bias (FBB) applied to the well influences device operation by decreasing the threshold voltage (Vt) of the transistor. This results in a faster operating device due to increase in the channel current at the expense an increased risk of current leakage. Conversely, a reverse body bias (RBB) applied to the well influences device operation by increasing the threshold voltage (Vt) of the transistor. This results in a device which exhibits a lower current leakage at the expense of a reduced speed. It is accordingly clear that circuit designers can use body bias selection to modulate transistor threshold voltage in effectuating a tradeoff between power and speed for the circuit operation.

There is an increased interest in circuits which operate at ultra-low voltage levels. For example, voltage levels equal to or less than 0.5V for digital circuitry are now becoming common in many applications such as with Internet of Things (IoT) oriented devices. It is common for that digital circuitry to operate in a suspended operating mode (such as sleep or deep-sleep), and when in this mode it is important that the transistors of the digital circuitry have reduced risk of current leakage. To address this concern, the circuit designer may choose to use a reverse body bias (RBB) applied to the well when the sleep (or deep-sleep) operating mode is active. When the digital circuitry is in an active operating mode, switching speed is needed and the circuit designer can choose to use a forward body bias (FBB) applied to the well. Thus, the concept of body bias modulation dependent on mode of digital circuit operation is a well-known strategy to dynamically ensure that the digital circuits can operate a targeted frequency while still supporting a reduction in power consumption.

The additional circuits and logic needed to support the body bias modulation will themselves consume power. In many cases the power reduction of the digital circuitry with body bias modulation dependent on mode of digital circuit operation is more than offset by the power consumption of the additional circuits and logic that are present to support the body bias modulation. The charge pump circuits needed to generate the negative bias voltages for reverse body bias (RBB) or the high bias voltages for forward body bias (FBB) consume large amounts of power and real estate on the chip. For a system on chip (SoC) that is relatively tiny, the area and power impact of the additional circuits and logic is significant. Effort must be made by the circuit designer to minimize the area and power impact.

SUMMARY

In an embodiment, a circuit comprises: a digital circuit powered by a power domain having a positive supply voltage and a ground supply voltage, wherein the digital circuit includes logic circuitry formed by a plurality of logic gates, where each logic gate of the plurality of logic gates includes at least one p-channel MOSFET having an n-body connected to an n-body bias node and at least one n-channel MOSFET having a p-body connected to a p-body bias node; and a body bias generator circuit configured to apply an n-body bias voltage to the n-body bias nodes of the p-channel MOSFETs in the plurality of logic gates and apply a p-body bias voltage to the p-body bias nodes of the n-channel MOSFETs in the plurality of logic gates, wherein the body bias generator circuit operates: in a first mode to apply the ground supply voltage to the n-body bias nodes in the plurality of logic gates as the n-body bias voltage and apply the positive supply voltage to the p-body bias nodes in the plurality of logic gates as the p-body bias voltage; and in a second mode to apply the positive supply voltage to the n-body bias nodes in the plurality of logic gates as the n-body bias voltage and apply the ground supply voltage to the p-body bias nodes in the plurality of logic gates as the p-body bias voltage.

In an embodiment, a circuit comprises: a digital circuit powered by a power domain having a positive supply voltage and a ground supply voltage, wherein the digital circuit includes logic circuitry formed by a plurality of logic gates, where each logic gate includes at least one p-channel MOSFET having an n-body connected to an n-body bias node and at least one n-channel MOSFET having a p-body connected to a p-body bias node; and a body bias generator circuit comprising: a first CMOS inverter circuit powered from the power domain having the positive supply voltage and the ground supply voltage, the first CMOS inverter circuit having an input configured to receive a first control signal and an output directly connected to the n-body bias nodes of the p-channel MOSFETs in the plurality of logic gates; and a second CMOS inverter circuit powered from the power domain having the positive supply voltage and the ground supply voltage, the second CMOS inverter circuit having an input configured to receive a second control signal and an output directly connected to the p-body bias nodes of the n-channel MOSFETs in the plurality of logic gates.

BRIEF DESCRIPTION OF THE DRAWINGS

For a better understanding of the embodiments, reference will now be made by way of example only to the accompanying figures in which.

DETAILED DESCRIPTION

Figure 1:
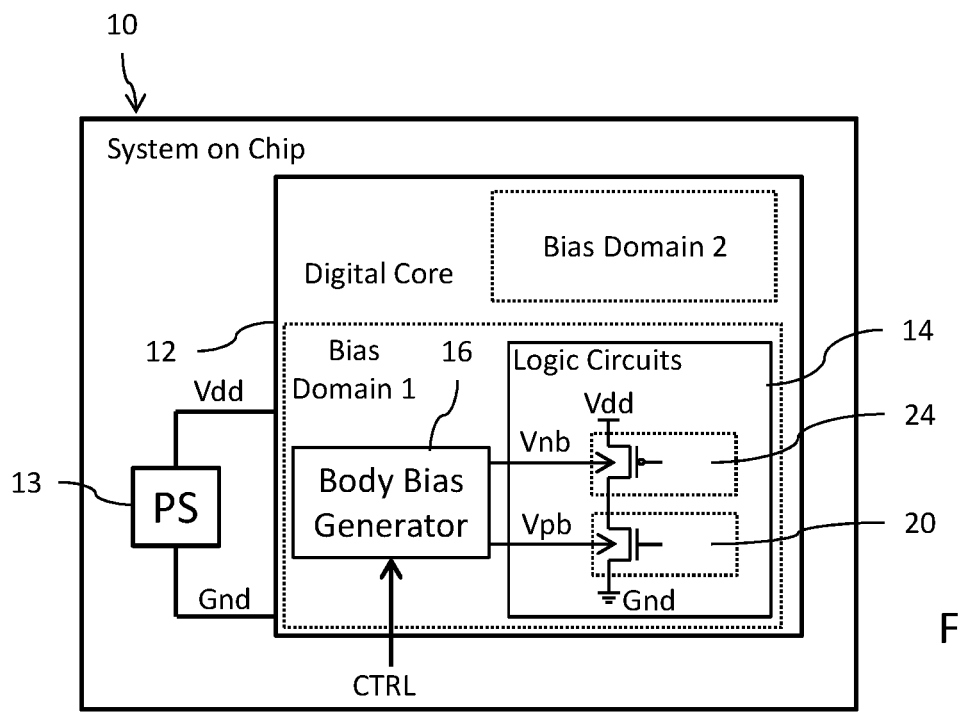
FIG. 1 is a block diagram of a system on chip (SoC)

Reference is now made to FIG. 1 which shows a block diagram of a system on chip (SoC) 10 which includes digital circuitry 12 (also referred to as a digital core) designed for operation at an ultra-low voltage level. The digital circuitry 12 is powered by a voltage power domain comprising a power supply voltage Vdd and a ground voltage Gnd. The voltage power domain is typically powered from a power supply (PS) circuit 13 (such as a voltage regulator and/or a power management circuit) present on-chip. The digital circuit 12 includes logic circuitry 14 made of complementary MOSFET (CMOS) devices (logic gates) which form, for example, logical AND, NAND, OR, NOR, XOR, inverter circuits and flip-flops (FFs). An inverter circuit is illustrated in FIG. 1 merely as an example.

The CMOS devices of the logic circuitry 14 comprise n-channel MOSFETs 20 (nMOS) and p-channel MOSFETs 24 (pMOS). The bodies of the n-channel MOSFETs 20 are biased by a p-body bias voltage Vpb and the bodies of the p-channel MOSFETs 24 are biased by an n-body bias voltage Vnb. For a given bias power domain all the transistors are dynamically body biased. Granularity of the biasing condition can be applied depending on the power domain. On the one hand, the core logic of a microprocessor in a first bias domain that requires speed in active mode could be dynamically biased. On the other hand, the memory could be placed in a non-dynamically biased second domain. In that case, the digital core will present two bias power domains both with their own logic yet one with a dynamic bias generator whereas the second domain will be statically biased. The voltage level of the p-body bias voltage Vpb is dynamically selectable to configure the n-channel MOSFETs 20 in either reverse body bias (RBB) or forward body bias (FBB) dependent on logic circuitry 14 operating mode. Likewise, the voltage level of the n-body bias voltage Vnb is dynamically selectable to configure the p-channel MOSFETs 24 in either reverse body bias (RBB) or forward body bias (FBB) dependent on logic circuitry 14 operating mode.

Figure 2A:
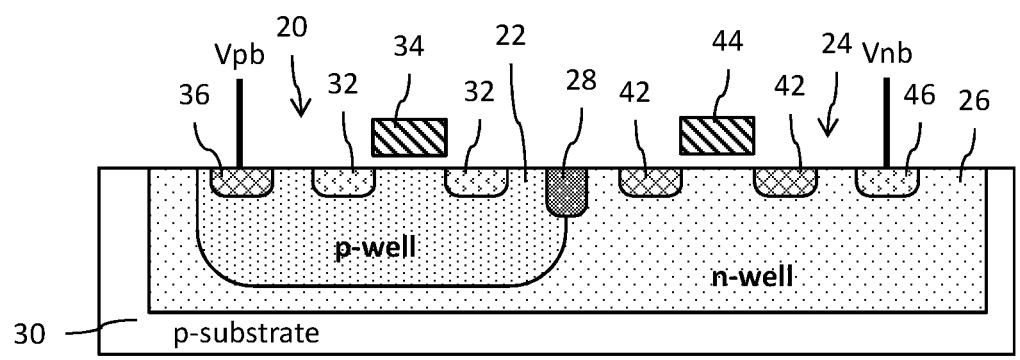
FIG. 2A is a cross-section of CMOS transistors implemented on a bulk substrate.
Figure 2B:
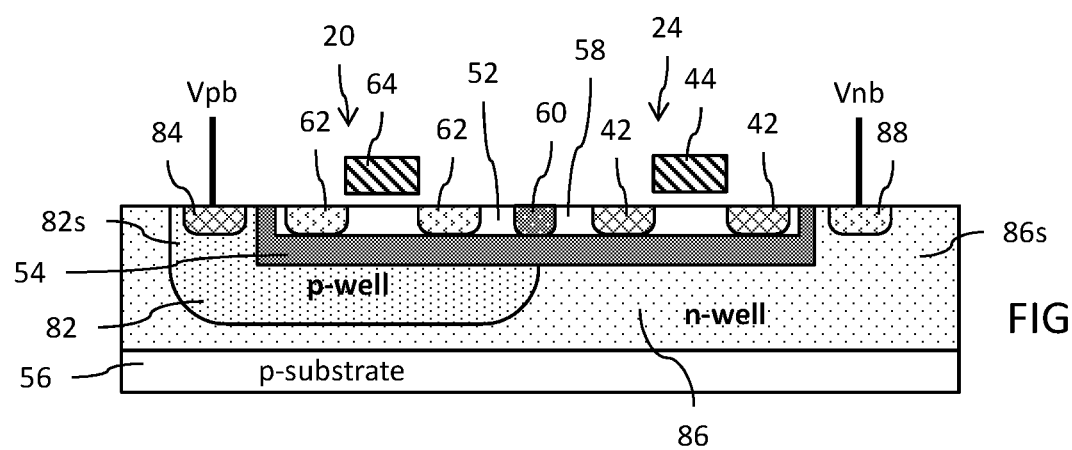
FIG. 2B is a cross-section of CMOS transistors implemented on a semiconductor on insulator (SOI) substrate.

The n-channel MOSFETs 20 (nMOS) and p-channel MOSFETs 24 (pMOS) may be supported in either a bulk substrate (see, FIG. 2A) or in a semiconductor on insulator (SOI) substrate (see, FIG. 2B). For the bulk substrate implementation of FIG. 2A, the n-channel MOSFET 20 (nMOS) is formed in a p-well 22 and the p-channel MOSFET 24 (pMOS) is formed in an n-well 26. The p-well 22 provides the body of the n-channel MOSFET 20 and the n-well 26 provides the body of the p-channel MOSFET 24. A trench isolation 28 at the upper surface of the bulk substrate 30 isolates the pMOS devices from the nMOS devices to avoid parasitic current. Source and drain regions 32 of n-type conductivity are provided in the p-well 22 for the n-channel MOSFET 20. The source and drain regions 32 are separated by a channel region and an insulated gate 34 is provided over the channel region. A p-type doped contact region 36 is provided in the p-well 22 for applying the p-body bias voltage Vpb to the body of the n-channel MOSFET 20. Source and drain regions 42 of p-type conductivity are provided in the n-well 26 for the p-channel MOSFET 24. The source and drain regions 42 are separated by a channel region and an insulated gate 44 is provided over the channel region. An n-type doped contact region 46 is provided in the n-well 26 for applying the n-body bias voltage Vnb to the body of the p-channel MOSFET 24 (pMOS).

For the SOI substrate implementation of FIG. 2B, the n-channel MOSFET 20 (nMOS) is formed in a first region 52 of a semiconductor layer (for example, of the fully-depleted type—FDSOI) supported by an insulating layer 54 over a support substrate 56. The p-channel MOSFET 24 (pMOS) is formed in a second region 58 of the semiconductor layer. A trench isolation 60 at the upper surface of the semiconductor layer isolates the region 52 from the region 58. Source and drain regions 62 of n-type conductivity are provided in the region 52 for the n-channel MOSFET 20. The source and drain regions 62 are separated by a channel region and an insulated gate 64 is provided over the channel region. Source and drain regions 72 of p-type conductivity are provided in the region 58 for the p-channel MOSFET 24. The source and drain regions 72 are separated by a channel region and an insulated gate 74 is provided over the channel region.

Within the support substrate 56, a p-well 82 is provided underneath the n-channel MOSFET 20 (nMOS), with the p-well 82 isolated from the region 52 of the semiconductor layer by the insulating layer 54. The p-well 82 provides the body (also referred to in the art as a back-gate) of the n-channel MOSFET 20. The p-well 82 includes a sinker region 82s extending from the upper surface of SOI substrate. A p-type doped contact region 84 is provided in the sinker region 82s for applying a p-body bias voltage Vpb to the body of the n-channel MOSFET 20.

Within the support substrate 56, an n-well 86 is provided underneath the p-channel MOSFET 24 (pMOS), with the n-well 86 isolated from the region 58 of the semiconductor layer by the insulating layer 54. The n-well 86 provides the body (also referred to in the art as a back-gate) of the p-channel MOSFET 24. The n-well 86 includes a sinker region 86s extending from the upper surface of SOI substrate. An n-type doped contact region 88 is provided in the sinker region 86s for applying an n-body bias voltage Vnb to the body of the p-channel MOSFET 24.

With reference once again to FIG. 1, a body bias generator circuit 16 generates the p-body bias voltage Vpb and the n-body bias voltage Vnb in response to a control signal CTRL. The logic state of the control signal CTRL may indicate, for example, whether reverse body bias (RBB) or forward body bias (FBB) is to be applied to the transistors of the logic circuitry 14. In an embodiment, the logic state of the control signal CTRL may be dependent on the operating mode (normal mode or sleep mode) of the digital circuitry 12 (digital core), wherein that operating mode could be controlled by the power supply (PS) circuit 13 or other SoC configuration circuitry.

Figure 3A:
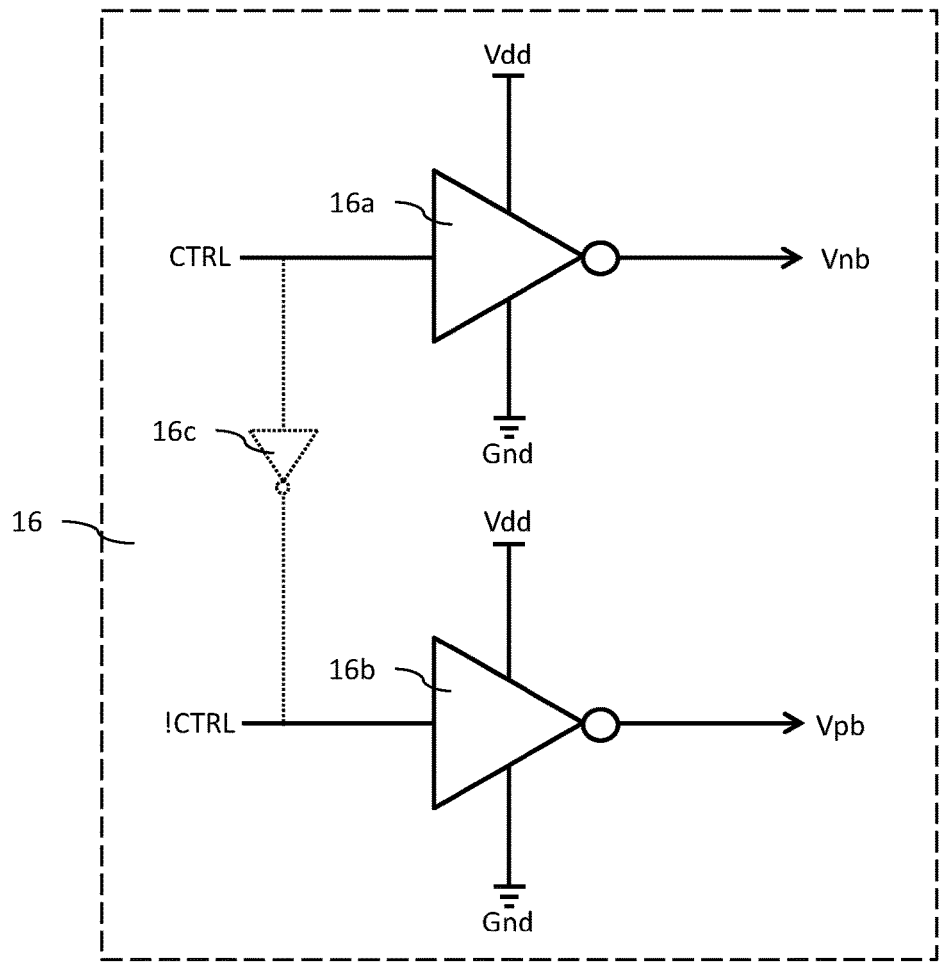
FIG. 3A is a circuit diagram of a switched body biasing circuit.

Reference is now made to FIG. 3A which shows a circuit diagram of the body bias generator circuit 16. The body bias generator circuit 16 includes a first CMOS inverter circuit 16a having an input configured to receive the control signal CTRL and an output configured to generate the n-body bias voltage Vnb. The first CMOS inverter circuit 16a is powered from the voltage power domain comprising the power supply voltage Vdd and the ground voltage Gnd. If the control signal CTRL has a logic "1" state which configures the body bias generator circuit 16 in a first mode of operation, the first CMOS inverter circuit 16a will apply a relatively lower voltage such as the ground voltage Gnd as the n-body bias voltage Vnb (i.e., Vnb=Gnd). Conversely, if the control signal CTRL has a logic "0" state which configures the body bias generator circuit 16 in a second mode of operation, the first CMOS inverter circuit 16a will apply a relatively higher voltage such as the power supply voltage Vdd as the n-body bias voltage Vnb (i.e., Vnb=Vdd).

The body bias generator circuit 16 further includes a second CMOS inverter circuit 16b having an input configured to receive the logical inverse of the control signal CTRL (i.e., !CTRL), for example, generated by inverter 16c, and an output configured to generate the p-body bias voltage Vpb. The second CMOS inverter circuit 16b is also powered from the voltage power domain comprising the power supply voltage Vdd and the ground voltage Gnd. If the control signal CTRL has a logic "1" state (i.e., !CTRL=0) which configures the body bias generator circuit 16 in the first mode of operation, the second CMOS inverter circuit 16b will apply the power supply voltage Vdd as the p-body bias voltage Vpb (i.e., Vpb=Vdd). Conversely, if the control signal CTRL has a logic "0" state (i.e., !CTRL=1) which configures the body bias generator circuit 16 in the second mode of operation, the second CMOS inverter circuit 16b will apply the ground voltage Gnd as the p-body bias voltage Vpb (i.e., Vpb=Gnd).

Figure 3B:
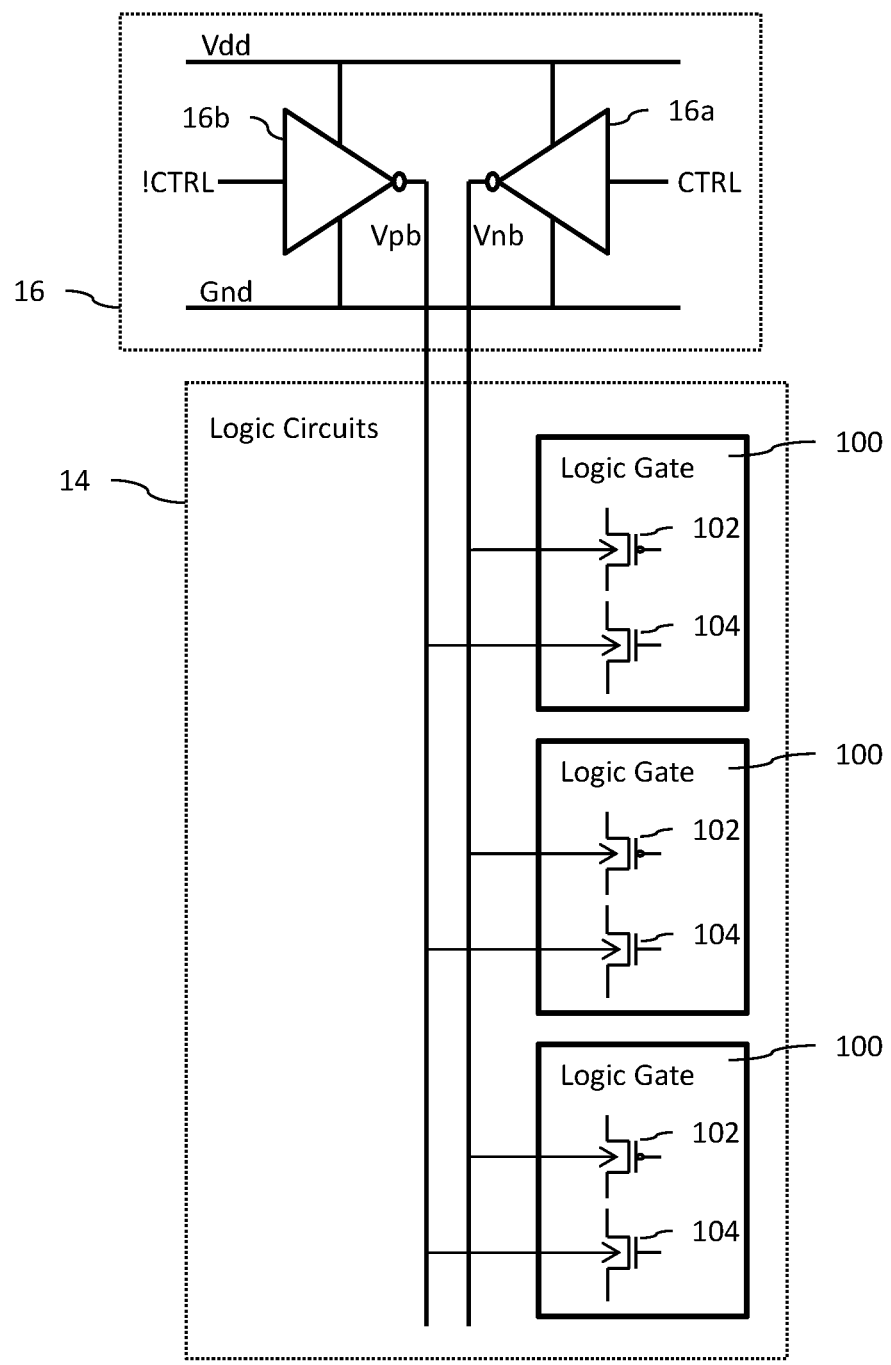
FIG. 3B shows additional detail of the body biasing configuration.

FIG. 3B shows additional detail. The logic circuits 14 comprise, for example, a plurality of logic gates 100, wherein each logic gate 100 includes at least one p-channel transistor 102 and at least one n-channel transistor 104. The logic gate may, for example, be a logical AND gate, a logical NAND gate, a logical OR gate, a logical NOR gate, a logical XOR gate, or a logical inverter gate. The output of the inverter 16a of the body bias generator 16 producing the n-body bias voltage Vnb in response to the logic state of the control signal CTRL is connected to the body of the p-channel transistors 102 within the plurality of logic gates 100. Thus, a single inverter 16a is provided to dynamically body bias the p-channel transistors 102 within the plurality of logic gates 100. Similarly, the output of the inverter 16b of the body bias generator 16 producing the p-body bias voltage Vpb in response to the logic state of the control signal !CTRL is connected to the body of the n-channel transistors 102 within the plurality of logic gates 100. Thus, a single inverter 16b is provided to dynamically body bias the n-channel transistors 104 within the plurality of logic gates 100.

The inverter 16c in FIG. 3A shows one implementation where the control signals CTRL and !CTRL are logic inverts of each other. This is not, however, a requirement. It will be understood that the logic state of the control signal CTRL may be generated in a manner which is completely independent of the logic state of the control signal !CTRL.

Figure 4A:
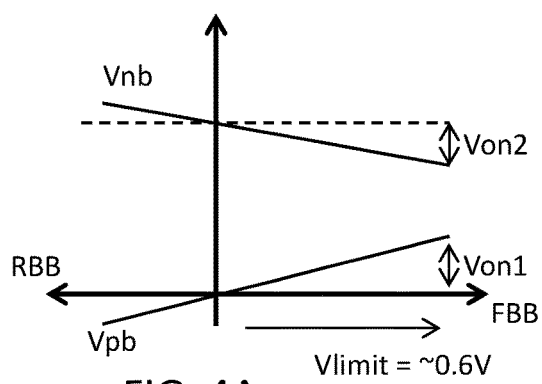
FIG. 4A is a graph showing the possible bias operating conditions for a NMOS and PMOS transistors implemented on a bulk substrate.

Reference is now made to FIG. 4A which shows that the available range of forward body bias is limited. For CMOS transistors implemented on a bulk substrate, the diodes between source and the p-well for the NMOS transistor and between drain and the n-well for the PMOS transistor will limit the benefit of FBB. Indeed, beyond the threshold voltages Von1 of the NMOS transistor diode and Von2 for the PMOS transistor, (generally defined around 0.6V yet technology dependent), leakage currents will appear and increase the power consumption of the system. Therefore, the amount of bias Vpb and Vnb is limited until Vlimit (~0.6 V). However, for an ultra-low voltage level this condition will never be satisfied if Vbn and Vpb are limited to a range from 0V to Vdd with Vdd<Von1 (and Von2). This justifies the implementation for bulk substrate circuits.

Figure 4B:
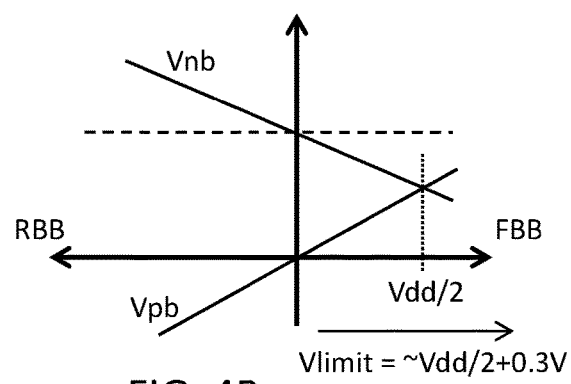
FIG. 4B is a graph showing the possible bias operating conditions for a NMOS and PMOS transistors implemented on a semiconductor on insulator (SOI) substrate.

Reference is now made to FIG. 4B which shows that the available range of forward body bias is limited. For CMOS transistors implemented on a silicon on insulator (SOI) substrate, the diodes between the p-well and the n-well will limit the benefit of FBB. Indeed, beyond the threshold voltages Vpn of the well diode leakage currents will appear and increase the power consumption of the system. In this case Vpn is both defined by Vnb and Vpb (Vpn=Vpb-Vnb). As Vpn~0.6V, assuming a symmetric voltage on the n and p well, it leads to a limit Vlimit=Vdd/2+300 mV for the possible range of bias. However, for an ultra-low voltage level this condition will never be satisfied on Vpn. This justifies the implementation for SOI substrate circuits.

Figure 5:
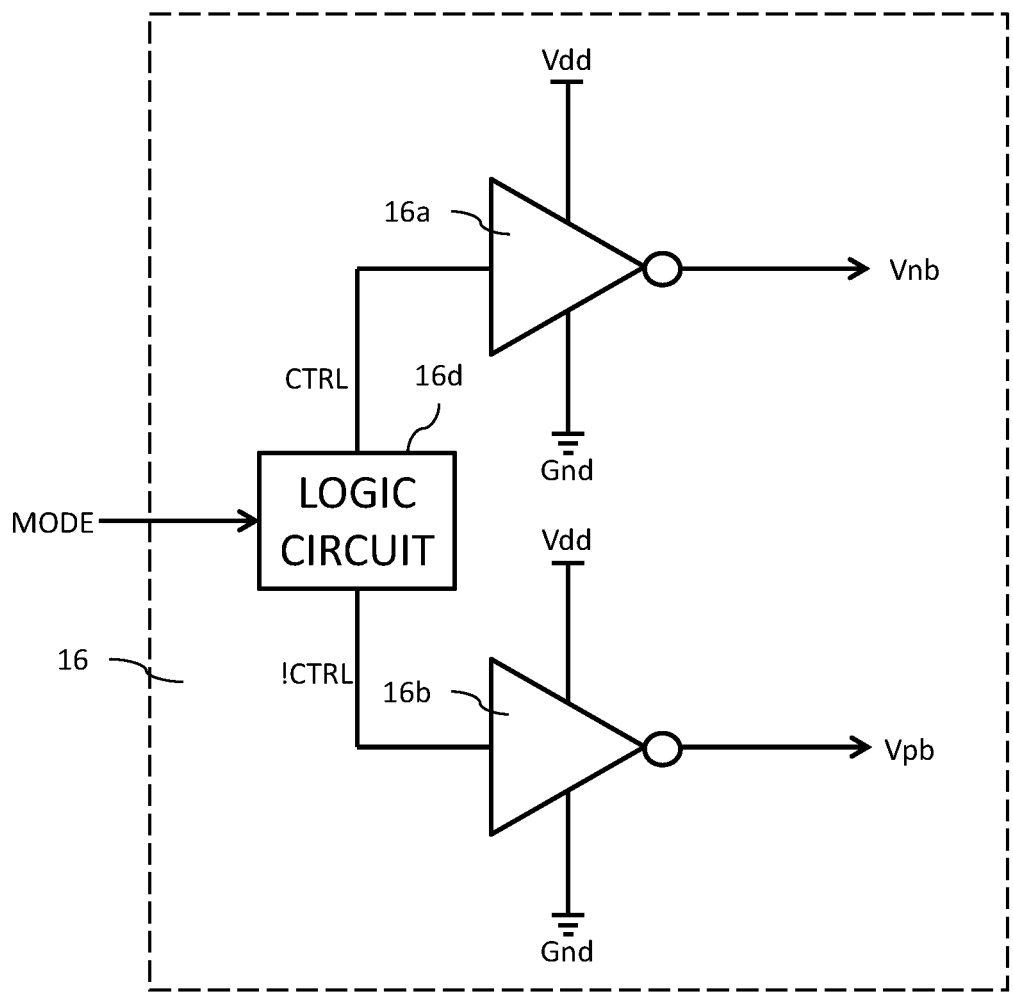
FIG. 5 is a circuit diagram of an alternative embodiment of the switched body biasing circuit.

Reference is now made to FIG. 5 to discuss an alternative implementation for the body bias generator circuit 16. In this embodiment, the logical inverse relationship between the signals CTRL and !CTRL is decoupled in order to support two additional modes of operation. The inverter 16c is omitted and a control logic circuit 16d instead used to independently generate the signals CTRL and !CTRL. Four modes of operation are possible: a) a first mode of operation where the control signal CTRL has a logic "1" state and the control signal !CTRL has a logic "0" state so that the first CMOS inverter circuit 16a applies the ground voltage Gnd as the n-body bias voltage Vnb (i.e., Vnb=Gnd) and the second CMOS inverter circuit 16b applies the power supply voltage Vdd as the p-body bias voltage Vpb (i.e., Vpb=Vdd); b) a second mode of operation where the control signal CTRL has a logic "0" state and the control signal !CTRL has a logic "1" state so that the first CMOS inverter circuit 16a applies the power supply voltage Vdd as the n-body bias voltage Vnb (i.e., Vnb=Vdd) and the second CMOS inverter circuit 16b applies the ground voltage Gnd as the p-body bias voltage Vpb (i.e., Vpb=Gnd); c) a third mode of operation where the control signal CTRL has a logic "1" state and the control signal !CTRL also has a logic "1" state so that both the first CMOS inverter circuit 16a and the second CMOS inverter circuit 16b apply the ground voltage Gnd as the n-body bias voltage Vnb (i.e., Vnb=Gnd) and p-body bias voltage Vpb (i.e., Vpb=Gnd), respectively (referred to here as a super forward body bias mode: On one hand, this super forward body bias mode covers other FD-SOI technologies where the normal operating bias conditions are Vpb=Vnb=Gnd; and on the other hand, this super forward body bias mode can be used to asymmetrically apply body biasing on the pMOS or nMOS network, in order to cover potential PVT variations); and d) a fourth third mode of operation where the control signal CTRL has a logic "0" state and the control signal !CTRL also has a logic "0" state so that both the first CMOS inverter circuit 16a and the second CMOS inverter circuit 16b apply power supply voltage Vdd as the n-body bias voltage Vnb (i.e., Vnb=Vdd) and p-body bias voltage Vpb (i.e., Vpb=Vdd), respectively (referred to here as a super reverse body bias mode: On one hand, this super reverse body bias mode is here to cover other FD-SOI technologies where the normal operating bias conditions are Vpb=Vnb=Vdd; and on the other hand, this super reverse body bias mode can be used to asymmetrically apply body biasing on the pMOS or nMOS network, in order to cover potential PVT variations). The logic circuit 16d is controlled by a mode selection signal MODE to select one of the four possible modes of operation.

The foregoing is applicable to the circuit implementation shown in FIG. 3B.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:
1. A circuit, comprising:
a digital circuit powered by a power domain having a positive supply voltage and a ground supply voltage, wherein the digital circuit includes logic circuitry formed by a plurality of logic gates, where each logic gate of the plurality of logic gates includes at least one p-channel MOSFET having an n-body connected to an n-body bias node and at least one n-channel MOSFET having a p-body connected to a p-body bias node; and
a body bias generator circuit configured to apply an n-body bias voltage to the n-body bias nodes of the p-channel MOSFETs in the plurality of logic gates and apply a p-body bias voltage to the p-body bias nodes of the n-channel MOSFETs in the plurality of logic gates, wherein the body bias generator circuit operates:
in a first mode to apply the ground supply voltage to the n-body bias nodes in the plurality of logic gates as the n-body bias voltage and apply the positive supply voltage to the p-body bias nodes in the plurality of logic gates as the p-body bias voltage; and
in a second mode to apply the positive supply voltage to the n-body bias nodes in the plurality of logic gates as the n-body bias voltage and apply the ground supply voltage to the p-body bias nodes in the plurality of logic gates as the p-body bias voltage.

2. The circuit of claim 1, wherein mode of the body bias generator circuit is selected by a logic state of a control signal.

3. The circuit of claim 2, wherein the body bias generator circuit comprises:
a first CMOS inverter circuit powered from the power domain having the positive supply voltage and the ground supply voltage, the first CMOS inverter circuit having an input configured to receive the control signal and an output directly connected to the n-body bias nodes of the p-channel MOSFETs in the plurality of logic gates; and
a second CMOS inverter circuit powered from the power domain having the positive supply voltage and the ground supply voltage, the second CMOS inverter circuit having an input configured to receive a logical inversion of the control signal and an output directly connected to the p-body bias nodes of the n-channel MOSFETs in the plurality of logic gates.

4. The circuit of claim 2, wherein a logic state of the control signal is indicative of whether the digital circuit is in a suspended operating mode.

5. The circuit of claim 1,
wherein each p-channel MOSFET is formed in an n-well of a bulk substrate, said n-well forming the n-body that is biased by the n-body bias voltage; and
wherein each n-channel MOSFET is formed in a p-well of the bulk substrate, said p-well forming the p-body that is biased by the p-body bias voltage.

6. The circuit of claim 1,
wherein each p-channel MOSFET is formed in a first semiconductor region of a semiconductor on insulator substrate including support substrate insulated from the first semiconductor region by an insulating layer, said support substrate including an n-well forming the n-body that is biased by the n-body bias voltage; and
wherein each n-channel MOSFET is formed in a second semiconductor region of the semiconductor on insulator substrate where the support substrate is insulated from the first semiconductor region by an insulating layer, said support substrate including a p-well forming the p-body that is biased by the p-body bias voltage.

7. The circuit of claim 1, wherein the body bias generator circuit further operates:
in a third mode to apply the ground supply voltage to both the n-body bias nodes in the plurality of logic gates as the n-body bias voltage and p-body bias nodes in the plurality of logic gates as the n-body bias voltage.

8. The circuit of claim 7, wherein selection between the first, second and third modes of the body bias generator circuit is made in response to a control signal.

9. The circuit of claim 1, wherein the body bias generator circuit further operates:
in a fourth mode to apply the positive supply voltage to both the n-body bias nodes in the plurality of logic gates as the n-body bias voltage and the p-body bias nodes in the plurality of logic gates as the n-body bias voltage.

10. The circuit of claim 9, wherein selection between the first, second and fourth modes of the body bias generator circuit is made in response to a control signal.

11. A circuit, comprising:
a digital circuit powered by a power domain having a positive supply voltage and a ground supply voltage, wherein the digital circuit includes logic circuitry formed by a plurality of logic gates, where each logic gate includes at least one p-channel MOSFET having an n-body connected to an n-body bias node and at least one n-channel MOSFET having a p-body connected to a p-body bias node; and
a body bias generator circuit comprising:
a first CMOS inverter circuit powered from the power domain having the positive supply voltage and the ground supply voltage, the first CMOS inverter circuit having an input configured to receive a first control signal and an output directly connected to the n-body bias nodes of the p-channel MOSFETs in the plurality of logic gates; and
a second CMOS inverter circuit powered from the power domain having the positive supply voltage and the ground supply voltage, the second CMOS inverter circuit having an input configured to receive a second control signal and an output directly connected to the p-body bias nodes of the n-channel MOSFETs in the plurality of logic gates.

12. The circuit of claim 11, wherein the second control signal is a logical inversion of the first control signal.

13. The circuit of claim 11, wherein the first and second control signals have logic states that are not dependent on each other.

14. The circuit of claim 11, further comprising a logic circuit configured to generate the first and second control signals, the logic circuit operating to control the body bias generator circuit to operate:
in a first mode to apply the ground supply voltage to the n-body bias nodes in the plurality of logic gates as an n-body bias voltage and the positive supply voltage to the p-body bias nodes in the plurality of logic gates as a p-body bias voltage; and
in a second mode to apply the positive supply voltage to the n-body bias nodes in the plurality of logic gates as the n-body bias voltage and the ground supply voltage to the p-body bias nodes in the plurality of logic gates as the p-body bias voltage.

15. The circuit of claim 14, wherein mode of the body bias generator circuit is selected by a mode selection signal.

16. The circuit of claim 15, wherein the mode selection signal is indicative of whether the digital circuit is in a suspended operating mode.

17. The circuit of claim 14, wherein the logic circuit further operates to control the body bias generator circuit to operate:
in a third mode to apply the ground supply voltage to both the n-body bias nodes in the plurality of logic gates as the n-body bias voltage and the p-body bias nodes in the plurality of logic gates as the n-body bias voltage.

18. The circuit of claim 17, wherein selection between the first, second and third modes of the body bias generator circuit is made in response to a mode selection signal.

19. The circuit of claim 14, wherein the logic circuit further operates to control the body bias generator circuit to operate:
   in a fourth mode to apply the positive supply voltage to both the n-body bias nodes in the plurality of logic gates as the n-body bias voltage and the p-body bias nodes in the plurality of logic gates as the n-body bias voltage.

20. The circuit of claim 19, wherein selection between the first, second and fourth modes of the body bias generator circuit is made in response to a mode selection signal.

21. The circuit of claim 11,
   wherein each p-channel MOSFET is formed in an n-well of a bulk substrate, said n-well forming an n-body biased by the n-body bias voltage; and
   wherein each n-channel MOSFET is formed in a p-well of the bulk substrate, said p-well forming a p-body biased by the p-body bias voltage.

22. The circuit of claim 11,
   wherein each p-channel MOSFET is formed in a first semiconductor region of a semiconductor on insulator substrate including support substrate insulated from the first semiconductor region by an insulating layer, said support substrate including an n-well forming an n-body biased by the n-body bias voltage; and
   wherein each n-channel MOSFET is formed in a second semiconductor region of the semiconductor on insulator substrate where the support substrate is insulated from the first semiconductor region by an insulating layer, said support substrate including a p-well forming a p-body biased by the p-body bias voltage.

* * * * *